(12) United States Patent
Harada

(10) Patent No.: US 9,136,145 B2
(45) Date of Patent: Sep. 15, 2015

(54) SEMICONDUCTOR INTEGRATED CIRCUIT DEVICE

(71) Applicant: Seiko Instruments Inc., Chiba (JP)

(72) Inventor: Hirofumi Harada, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 80 days.

(21) Appl. No.: 13/846,584

(22) Filed: Mar. 18, 2013

(65) Prior Publication Data

US 2013/0249119 A1  Sep. 26, 2013

(30) Foreign Application Priority Data

Mar. 23, 2012  (JP) ................................. 2012-068014

(51) Int. Cl.
*H01L 21/58* (2006.01)
*H01L 23/00* (2006.01)
*H01L 23/495* (2006.01)

(52) U.S. Cl.
CPC .......... *H01L 21/58* (2013.01); *H01L 23/49513* (2013.01); *H01L 24/29* (2013.01); *H01L 24/32* (2013.01); *H01L 23/4952* (2013.01); *H01L 24/48* (2013.01); *H01L 24/49* (2013.01); *H01L 24/73* (2013.01); *H01L 2224/05624* (2013.01); *H01L 2224/2919* (2013.01); *H01L 2224/32245* (2013.01); *H01L 2224/4848* (2013.01); *H01L 2224/48091* (2013.01); *H01L 2224/48247* (2013.01); *H01L 2224/48257* (2013.01); *H01L 2224/48465* (2013.01); *H01L 2224/73265* (2013.01); *H01L 2924/00014* (2013.01); *H01L 2924/07802* (2013.01); *H01L 2924/13091* (2013.01)

(58) Field of Classification Search
CPC ........................ H01L 2224/80; H01L 2924/41
USPC .......................................................... 257/783
See application file for complete search history.

(56) References Cited

U.S. PATENT DOCUMENTS

| | | | |
|---|---|---|---|
| 7,985,991 B2* | 7/2011 | Kajiwara et al. | 257/268 |
| 8,331,069 B2* | 12/2012 | Galy et al. | 361/56 |
| 2008/0224229 A1* | 9/2008 | Tajima et al. | 257/379 |
| 2010/0122904 A1* | 5/2010 | Hassibi et al. | 204/403.01 |
| 2012/0286412 A1* | 11/2012 | Kimura et al. | 257/676 |

FOREIGN PATENT DOCUMENTS

JP         05160333       6/1993

* cited by examiner

*Primary Examiner* — Roy Potter
*Assistant Examiner* — Damian A Hillman
(74) *Attorney, Agent, or Firm* — Adams & Wilks

(57) ABSTRACT

Provided is a semiconductor integrated circuit device having flexible pin arrangement. A semiconductor integrated circuit is bonded to a die pad with an insulating paste, and the potential of the die pad is fixed through a bonding wire from an Al pad provided on the surface of the semiconductor integrated circuit. In the case of a P-type semiconductor substrate, the die pad is set as a terminal other than a terminal having a minimum operating potential of the semiconductor integrated circuit.

9 Claims, 4 Drawing Sheets

SEMICONDUCTOR INTEGRATED CIRCUIT DEVICE

BACKGROUND OF THE INVENTION

1. Field of the Invention

The present invention relates to a mounting configuration of a semiconductor integrated circuit.

2. Description of the Related Art

Various semiconductor substrates suitable for different applications are available for producing a semiconductor integrated circuit. Most of the semiconductor substrates are N-type semiconductor substrates containing N-type impurities such as phosphorus and P-type semiconductor substrates containing P-type impurities such as boron.

When an N-type semiconductor substrate is used for producing a semiconductor integrated circuit including a CMOS circuit, a configuration as illustrated in FIG. 4A is employed. Specifically, a P-type well region 6 is provided in an integrated circuit chip 2 using an N-type semiconductor substrate 2, and an N-channel MOS transistor (hereinafter referred to as NMOS) 102 and a P-channel MOS transistor (hereinafter referred to as PMOS) 101 are integrated on the N-type semiconductor substrate in this P-type region and in the other region, respectively. Then, the NMOS 102 and the PMOS 101 are connected by metal wiring to constitute a circuit. In this case, in order to reliably separate and insulate the P-type well region and the N-type semiconductor substrate from each other, the potential of the P-type well region is fixed to a minimum potential (hereinafter referred to as VSS potential) of the semiconductor integrated circuit and the potential of the N-type semiconductor substrate is fixed to a maximum potential (hereinafter referred to as VDD potential) of the semiconductor integrated circuit. In this way, a forward current is prevented from flowing in the N-type semiconductor substrate and the P-type well region.

Specifically, all terminals in the circuit which have the VDD potential, including a source terminal 4 of the PMOS, are connected to the N-type heavily doped diffusion region 13 provided on the N-type semiconductor substrate for electrically connecting the potentials, and define a VDD pad 103. In the same way, all terminals in the circuit which have the VSS potential, including a source terminal 5 of the NMOS, are connected to the P-type heavily doped diffusion region 12 provided in the P-type well region, and define a VSS pad 104.

On the other hand, in the case of integrating semiconductor elements on a P-type semiconductor substrate, as illustrated in FIG. 4B, all terminals in the circuit which have the VSS potential, including a source terminal 5 of the NMOS, are connected to the P-type heavily doped diffusion region 12 provided for electrically connecting the potential to the integrated circuit chip 1 using the P-type semiconductor substrate 1. In the same way, all terminals in the circuit which have the VDD potential, including a source terminal 4 of the PMOS, are connected to the N-type heavily doped diffusion region 13 provided in the N-type well region 7.

In the case of the above-mentioned configurations, the semiconductor integrated circuit using an N-type semiconductor substrate has the VDD potential in the entire N-type region inside the semiconductor substrate and along the bottom and side surfaces of the semiconductor substrate excluding the element formation region on the surface of the semiconductor substrate, and the semiconductor integrated circuit using a P-type semiconductor substrate has the VSS potential in the entire P-type region inside the semiconductor substrate and along the bottom and side surfaces of the semiconductor substrate excluding the element formation region on the surface of the semiconductor substrate. Accordingly, when the semiconductor substrate is diced into individual chips through a dicing step and the like, a semiconductor substrate having the VDD potential or the VSS potential is exposed in regions other than the surface of the semiconductor substrate.

For various reasons, the N-type semiconductor substrate and the P-type semiconductor substrate are used for different applications. The selection of the substrates depends on, for example, the performance of a mounting element such as a transistor and the circuit requirements as well as the structural convenience of a module substrate and a module circuit for mounting the semiconductor integrated circuit device.

One possible case is to control a back bias of a specific MOS transistor in the semiconductor integrated circuit in view of restrictions of circuit operation. For example, in FIG. 4A, the control of a back bias of the NMOS transistor from a circuit can be realized by disconnecting the P-type heavily doped diffusion region 12 in the P-type well region 6 of the specific NMOS 102 from the source of the NMOS and connecting wiring extended to the P-type heavily doped diffusion region to a circuit for controlling the back bias. In this way, in the case of the N-type semiconductor substrate, the P-type well region in which the NMOS is mounted can be separately and individually formed, and hence the potential of a specific P-type well region can be changed to control the back bias of the NMOS.

By the way, in the case of using a P-type semiconductor substrate as illustrated in FIG. 4B, all the P-type regions in which the NMOS is mounted are connected to have the same potential, and hence the control of a back bias of a specific NMOS cannot be conducted. Under those circuit requirements, the N-type semiconductor substrate is selected.

FIGS. 2A and 2B illustrate a semiconductor integrated circuit using an N-type semiconductor substrate mounted in a package after separation into individual chips through a dicing step and the like. FIG. 2A is a schematic cross-sectional view, and FIG. 2B is a plan view showing a lead frame. In FIG. 2A, the diced semiconductor integrated circuit chip 2 is bonded on a die pad 9 in a molded metal lead frame via an adhesive paste 8, and the die pad is electrically connected to a metal VDD pad 103 formed on the semiconductor integrated circuit chip via a bonding wire 10 formed thereafter. The semiconductor chip has an N-type well region 6 and a P-type well region 7, and is covered with mold resin 11. As exemplified in FIG. 2B, in general, the semiconductor integrated circuit chip has a plurality of pads (103, 104) for electrical connection. Thus, leads (terminals) corresponding to the pads are prepared also on the lead frame side, and the pads and the leads are connected via bonding wires.

In this case, in general, the adhesive paste uses a silver paste in order to obtain electrical connection between the die pad provided under the semiconductor integrated circuit chip and the exposed semiconductor substrate. The semiconductor integrated circuit chip in this example uses an N-type semiconductor substrate, and hence the die pad 9 bonded to the N-type semiconductor substrate via the silver paste is set as a VDD terminal as it is. Then, as illustrated in FIG. 2B, the die pad is connected to a VDD pad 103 formed on the surface of the semiconductor integrated circuit chip via the bonding wire.

A method of bonding the semiconductor integrated circuit chip to the die pad and electrically connecting the die pad by the bonding wire is disclosed in, for example, Japanese Patent Application Laid-open No. Hei 5-160333.

However, in the case where the polarity of the semiconductor substrate is changed, the conventional mounting method has the following problem.

For a wider variety of lineup of the semiconductor integrated circuit device, if there are restrictions that only the semiconductor integrated circuit device needs to be replaced by one having new performance without changing a module in which the existing semiconductor integrated circuit device is mounted, it is necessary to match attributes of a terminal of the existing module and a terminal connected to the die pad of the semiconductor integrated circuit device (pin-compatibility). In this case, the largest factor of inhibiting the pin-compatibility is the difference in polarity of the semiconductor substrate.

Using FIGS. 3A and 3B, for example, it is explained that the die pad used in FIGS. 2A and 2B, which is an example of using an N-type semiconductor substrate, cannot mount a semiconductor integrated circuit chip 1 having the same function as that produced by using a P-type semiconductor substrate. FIGS. 3A and 3B illustrate a semiconductor integrated circuit using a P-type semiconductor substrate mounted in a package. FIG. 3A is a schematic cross-sectional view, and FIG. 3B is a plan view showing a lead frame. Since the potential of the P-type semiconductor substrate is set to the VSS potential as illustrated in FIGS. 3A and 3B, the die pad 9 connected to the P-type semiconductor substrate via the silver paste is also a VSS terminal as it is, and it is necessary to change the VDD terminal in FIG. 2B to the VSS terminal in the example shown by FIG. 3B. Accordingly, in order to use the same die pad, it is necessary to make circuit design intended for the N-type semiconductor substrate, but such circuit design cannot be made in some cases because of circuit requirements. Thus, the design flexibility is significantly hindered.

One of the most reliable methods is a method of designing and manufacturing, for each module substrate for mounting, a new die pad suitable for pin arrangement of the existing module without adding a design change in the semiconductor integrated circuit device. This method, however, has a disadvantage that the cost and the launch and check periods for production of a new die pad are necessary, leading to the cost increase also in terms of volume efficiency.

A method capable of designing a semiconductor integrated circuit chip regardless of pin attributes of the existing module substrate and easily realizing pin-compatibility in a mounting step has thus been sought after.

SUMMARY OF THE INVENTION

In order to solve the above-mentioned problem, the present invention uses the following means.

First, according to an exemplary embodiment of the present invention, there is provided a semiconductor integrated circuit device, including: a semiconductor integrated circuit including a P-type semiconductor substrate; a die pad made of metal, on which the semiconductor integrated circuit is mounted; and an insulating paste having a volume resistivity of $1 \times 10^{12}$ Ω·cm or more, for bonding the semiconductor integrated circuit and the die pad to each other, in which the die pad serves as a terminal other than a terminal having a minimum operating potential of the semiconductor integrated circuit.

Further, in the semiconductor integrated circuit device, the terminal other than the terminal having the minimum operating potential of the semiconductor integrated circuit serves as a terminal having a maximum operating potential of the semiconductor integrated circuit.

Note that, according to another exemplary embodiment of the present invention, there is provided a semiconductor integrated circuit device, including: a semiconductor integrated circuit including an N-type semiconductor substrate; a die pad made of metal, on which the semiconductor integrated circuit is mounted; and an insulating paste having a volume resistivity of $1 \times 10^{12}$ Ω·cm or more, for bonding the semiconductor integrated circuit and the die pad to each other, in which the die pad serves as a terminal other than a terminal having a maximum operating potential of the semiconductor integrated circuit.

Further, in the semiconductor integrated circuit device, the terminal other than the terminal having the maximum operating potential of the semiconductor integrated circuit serves as a terminal having a minimum operating potential of the semiconductor integrated circuit.

The present invention can provide a method of mounting a semiconductor integrated circuit device, which can employ the same die pad regardless of whether the polarity of the semiconductor substrate is P or N.

DETAILED DESCRIPTION OF THE PREFERRED EMBODIMENT

Figure 1A:
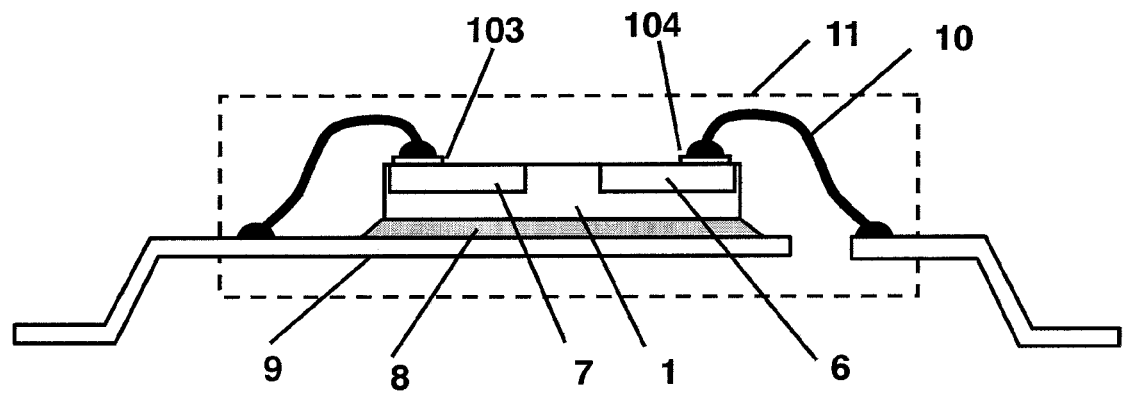
FIG. 1A is a schematic cross-sectional view including a semiconductor integrated circuit device according to a first embodiment of the present invention.
Figure 1B:
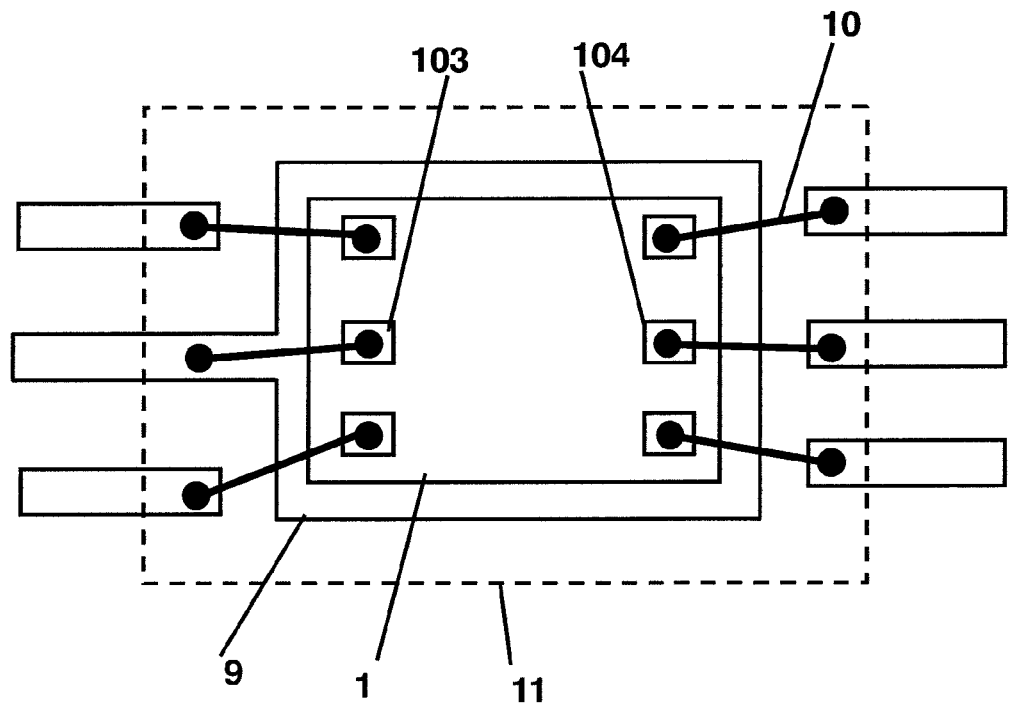
FIG. 1B is a plan view including the semiconductor integrated circuit device according to the first embodiment of the present invention.

An embodiment of the present invention is described below with reference to the accompanying drawings. FIGS. 1A and 1B are a cross-sectional view and a plan view of a semiconductor integrated circuit device that employs a mounting method according to the present invention.

Referring to FIGS. 1A and 1B, a semiconductor integrated circuit chip using a P-type semiconductor substrate 1 is bonded on a die pad 9 via an adhesive paste 8. The adhesive paste as used herein is an insulating paste having a resistivity of $1 \times 10^{12}$ Ω·cm or more. Accordingly, the P-type semiconductor substrate and the die pad thereunder are electrically insulated from each other, and no current flows even when there is a potential difference.

Figure 4A:
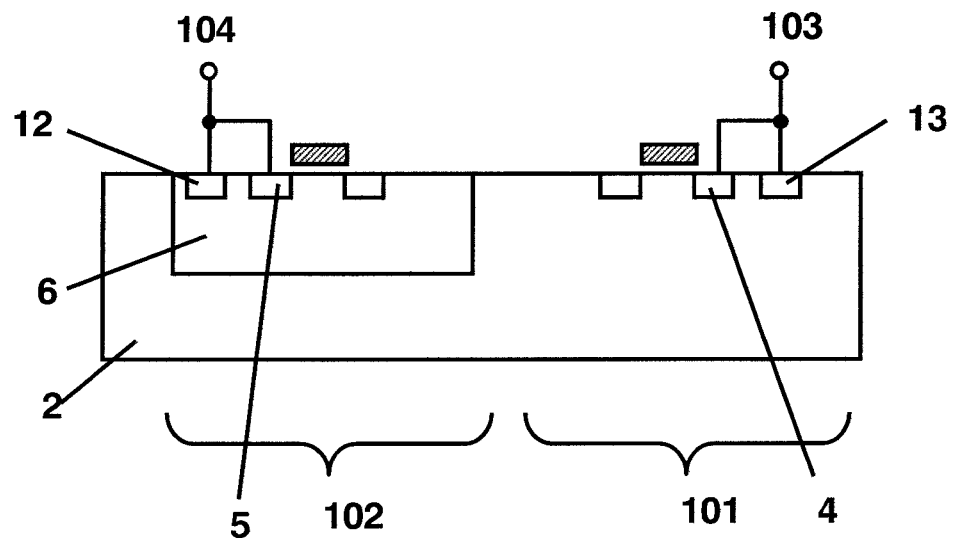
FIG. 4A is a schematic cross-sectional view including a CMOS circuit formed on a P-type semiconductor substrate.
Figure 4B:
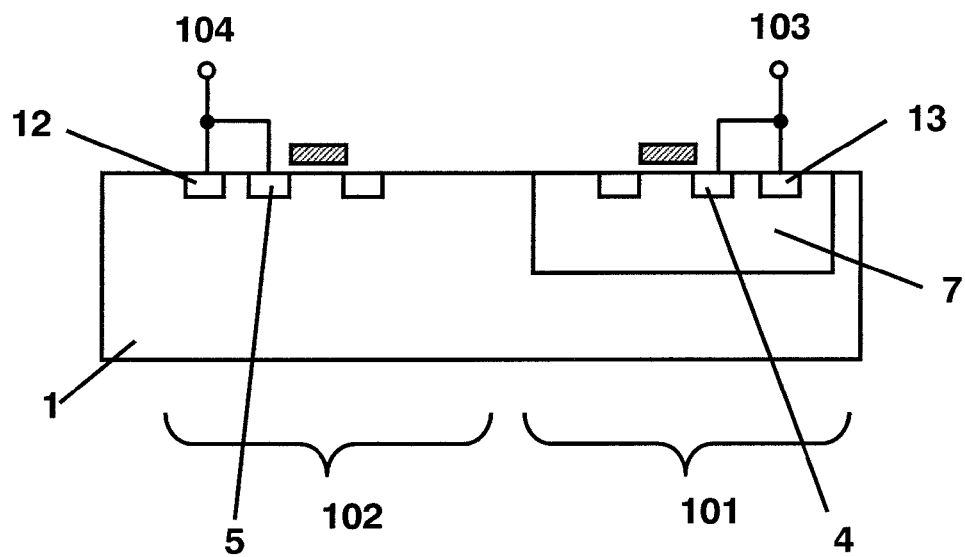
FIG. 4B is a schematic cross-sectional view including a CMOS circuit formed on an N-type semiconductor substrate.

The die pad 9 having the P-type semiconductor substrate bonded thereon is electrically connected to a VDD pad 103 having a maximum potential of the semiconductor integrated circuit via a bonding wire 10. Although not illustrated, the VDD terminal is connected to an N-type well region 7 (FIG. 4B) via metal wiring and an N-type heavily doped diffusion region. A VSS pad 104, on the other hand, is electrically connected to another terminal via a bonding wire, and is connected to a P-type well region 6 having a minimum potential of the circuit or another element terminal having the minimum potential.

This semiconductor integrated circuit chip and the bonding wires are surrounded by a mold resin 11 to be protected from an external environment. On the other hand, one ends of a plurality of leads are exposed to the outside from the mold resin as illustrated in FIG. 1B, thereby being connectable to another circuit substrate.

Figure 2A:
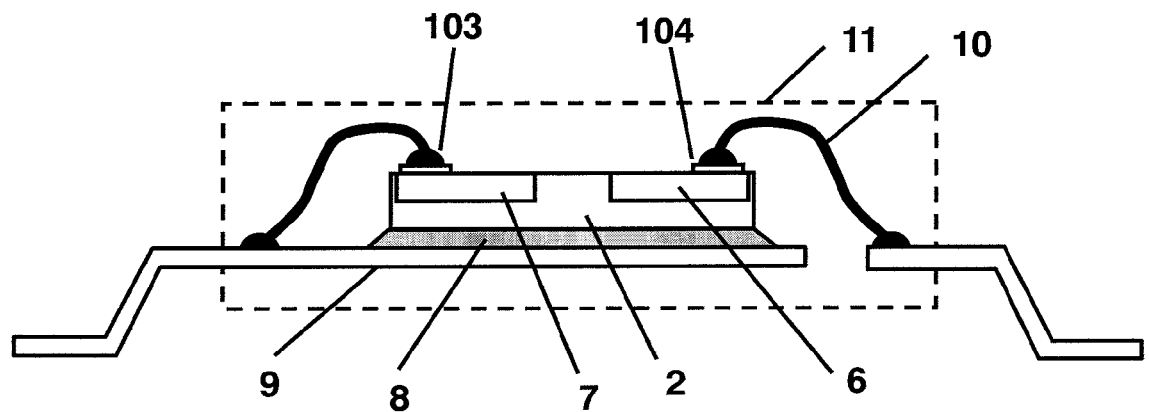
FIG. 2A is a schematic cross-sectional view including a conventional semiconductor integrated circuit device.
Figure 2B:
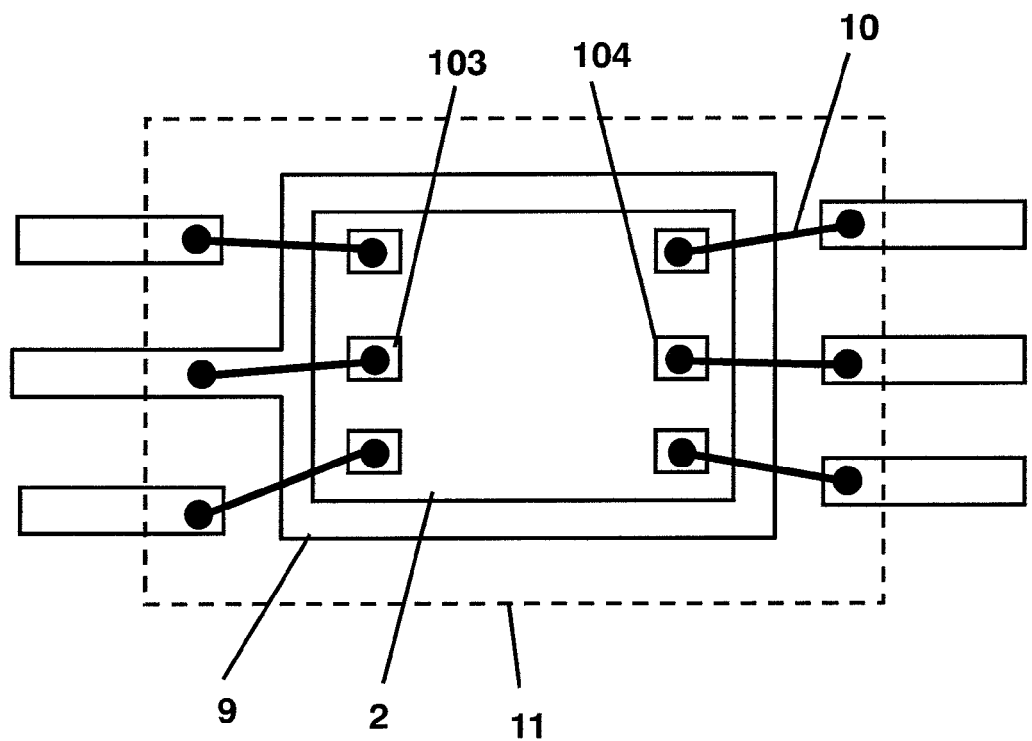
FIG. 2B is a plan view of the conventional semiconductor integrated circuit device.
Figure 3A:
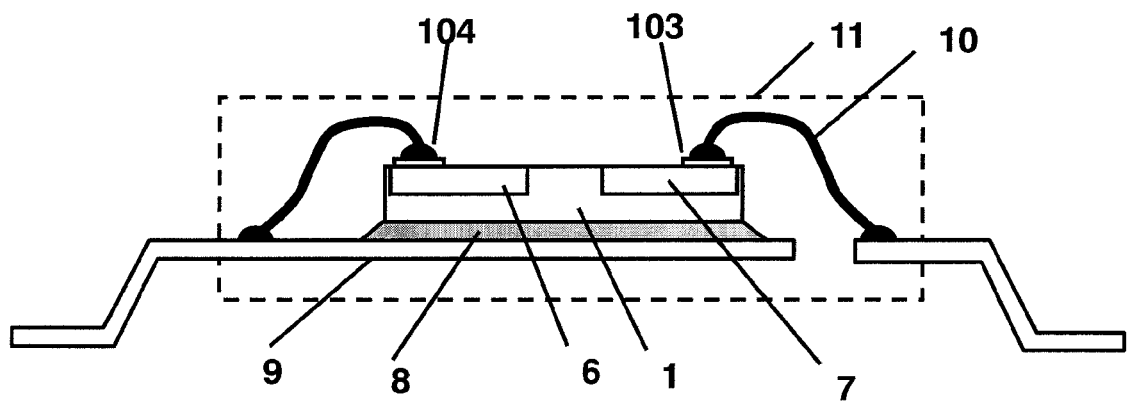
FIG. 3A is a schematic cross-sectional view including another conventional semiconductor integrated circuit device.
Figure 3B:
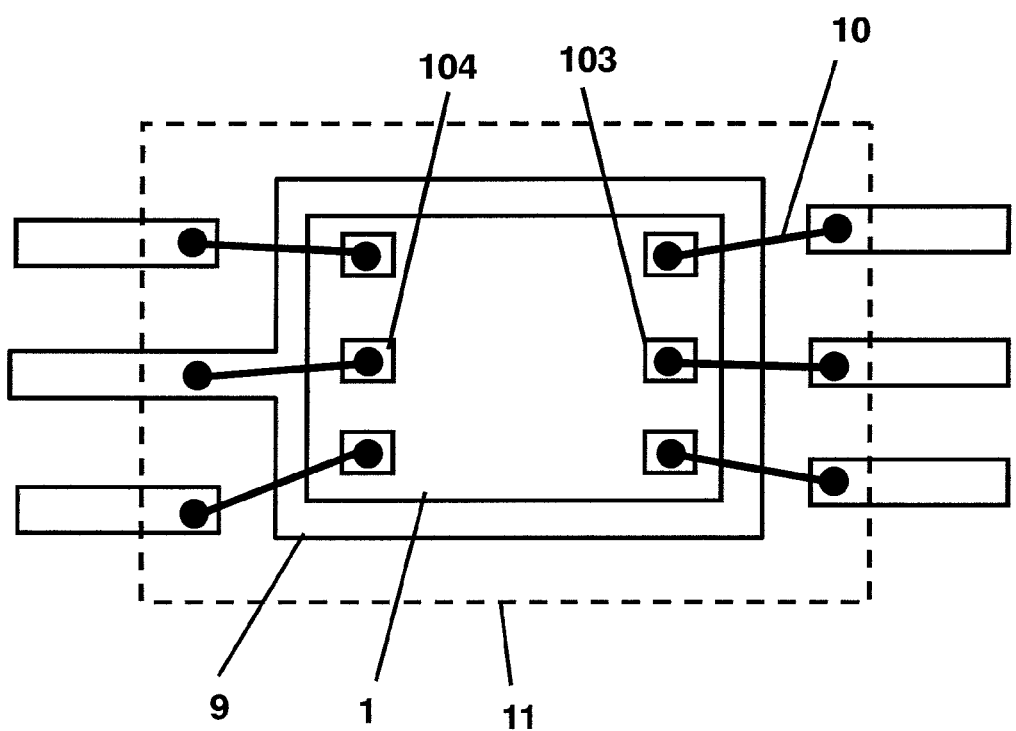
FIG. 3B is a plan view of the another conventional semiconductor integrated circuit device.

This terminal configuration is the same as the terminal configuration of the semiconductor integrated circuit device using the N-type semiconductor substrate illustrated in FIGS. 2A and 2B, and hence pin-compatibility can be ensured. The reason is, as described above, that the semiconductor integrated circuit chip is bonded on the die pad via the insulating paste although the P-type semiconductor substrate is used and hence the potential of the die pad can be freely set regardless of the substrate of the semiconductor integrated circuit chip provided thereon. Thus, the die pad can be set to a VDD terminal, though the die pad is a VSS terminal in the conventional example.

In the examples of FIGS. 1A and 1B and FIGS. 2A and 2B, the flexibility of handling the VDD terminal and the VSS terminal has been described. In the present invention, since the potential of the die pad for mounting the semiconductor integrated circuit chip can be set individually, it is possible to support various terminals other than the VDD terminal and the VSS terminal, such as an output voltage terminal and an ON/OFF switch terminal. Thus, wide pin-compatibility can be realized.

Although the semiconductor integrated circuit mounted on the P-type semiconductor substrate has been exemplified above with reference to FIGS. 1A and 1B, it should be understood that this technology is also applicable similarly to an N-type semiconductor substrate. That is, in the case where an N-type semiconductor substrate having a semiconductor integrated circuit mounted thereon is bonded on a die pad via an insulating paste, the die pad provided under the N-type semiconductor substrate, whose potential should have been set VDD conventionally, can be assigned to an arbitrary terminal. Accordingly, the pin-compatibility with the semiconductor integrated circuit device using an N-type semiconductor substrate and the existing semiconductor integrated circuit device using a P-type semiconductor substrate can be easily achieved.

Another advantage in the semiconductor integrated circuit device using an N-type semiconductor substrate is that no consideration needs to be given to a metal migration phenomenon because the potential of the die pad on which the N-type semiconductor substrate is bonded is set to be low.

By the way, the insulating paste essential for the present invention generally has a thermal conductivity lower than a metal paste. Thus, the insulating paste has a feature that, in the case where the semiconductor integrated circuit chip handles a large amount of current, generated heat resulting from the large current is less dissipated, reducing the allowable power dissipation of a mount package, and hence the insulating paste is not suitable for the use in a high temperature environment and in a large current operation. Accordingly, it can be said that the present invention is the most preferred technology for a semiconductor integrated circuit having current consumption of 100 µA or less, which generates less heat and is therefore not concerned about the thermal conductivity.

What is claimed is:

1. A semiconductor integrated circuit device, comprising:
   a semiconductor integrated circuit including a P-type semiconductor substrate;
   a die pad made of metal, on which the semiconductor integrated circuit is mounted; and
   an insulating paste having a volume resistivity of $1 \times 10^{12}$ Ω·cm or more, for bonding the semiconductor integrated circuit and the die pad to each other,
   wherein the die pad serves as a terminal other than a terminal having a minimum operating potential of the semiconductor integrated circuit, and
   wherein the terminal other than the terminal having the minimum operating potential of the semiconductor integrated circuit serves as a terminal having a maximum operating potential of the semiconductor integrated circuit.

2. A semiconductor integrated circuit device according to claim 1, wherein the semiconductor integrated circuit has a current consumption of 100 µA or less.

3. A semiconductor integrated circuit device, comprising:
   a semiconductor integrated circuit including an N-type semiconductor substrate;
   a die pad made of metal, on which the semiconductor integrated circuit is mounted; and
   an insulating paste having a volume resistivity of $1 \times 10^{12}$ Ω·cm or more, for bonding the semiconductor integrated circuit and the die pad to each other,
   wherein the die pad serves as a terminal other than a terminal having a maximum operating potential of the semiconductor integrated circuit.

4. A semiconductor integrated circuit device according to claim 3, wherein the terminal other than the terminal having the maximum operating potential of the semiconductor integrated circuit serves as a terminal having a minimum operating potential of the semiconductor integrated circuit.

5. A semiconductor integrated circuit device according to claim 3, wherein the semiconductor integrated circuit has a current consumption of 100 µA or less.

6. A semiconductor integrated circuit device according to claim 1, wherein the semiconductor integrated circuit has a terminal arrangement that is pin-compatible with the terminal arrangement of another semiconductor integrated circuit whch is the same as the first-mentioned semiconductor integrated circuit except that it has an N-type substrate and is bonded to the die pad using a conductive paste.

7. A semiconductor integrated circuit device according to claim 1, wherein the semiconductor integrated circuit has a terminal configuration the same as that of another semiconductor integrated circuit whch is the same as the first-mentioned semiconductor integrated circuit except that it has an N-type substrate and is bonded to the die pad using a conductive paste.

8. A semiconductor integrated circuit device according to claim 3, wherein the semiconductor integrated circuit has a terminal arrangement that is pin-compatible with the terminal arrangement of another semiconductor integrated circuit whch is the same as the first-mentioned semiconductor integrated circuit except that it has a P-type substrate and is bonded to the die pad using a conductive paste.

9. A semiconductor integrated circuit device according to claim 3, wherein the semiconductor integrated circuit has a terminal configuration the same as that of another semiconductor integrated circuit whch is the same as the first-mentioned semiconductor integrated circuit except that it has a P-type substrate and is bonded to the die pad using a conductive paste.

* * * * *